(12) United States Patent
Trüggelmann et al.

(10) Patent No.: US 6,259,035 B1
(45) Date of Patent: Jul. 10, 2001

(54) CHIP CARD

(75) Inventors: Uwe Trüggelmann, Paderborn; Karlheinz Wendisch, Salzkotten, both of (DE)

(73) Assignee: ORGA Kartensysteme GmbH, Paderborn (DE)

( * ) Notice: Subject to any disclaimer, the term of this patent is extended or adjusted under 35 U.S.C. 154(b) by 0 days.

(21) Appl. No.: 08/981,014
(22) PCT Filed: Jun. 24, 1996
(86) PCT No.: PCT/DE96/01105
§ 371 Date: Dec. 22, 1997
§ 102(e) Date: Dec. 22, 1997
(87) PCT Pub. No.: WO97/01823
PCT Pub. Date: Jan. 16, 1997

(30) Foreign Application Priority Data

Jun. 27, 1995 (DE) .............................................. 195 23 242
Sep. 1, 1995 (DE) .............................................. 195 32 223

(51) Int. Cl.[7] .................................................. G06K 19/077
(52) U.S. Cl. ......................... 174/250; 235/491; 157/679; 361/737; 427/135
(58) Field of Search ..................................... 235/491, 492; 257/679; 902/26; 361/737; 174/250; 434/300, 301; 427/135

(56) References Cited

U.S. PATENT DOCUMENTS 4,725,111   2/1988   Weitzen et al. ......................... 359/12

FOREIGN PATENT DOCUMENTS

| 4328469A1 | 3/1995 | (DE) . |
| 0412316A2 | 7/1990 | (EP) . |
| 2695234 | 3/1994 | (FR) . |
| 9402192 | 2/1994 | (WO) . |

OTHER PUBLICATIONS

Dettner, Dr. Heinz W, et al., "Handbuch Der Galvanotechnik".

Primary Examiner—Albert W. Paladini
(74) Attorney, Agent, or Firm—Cohen, Pontani, Lieberman & Pavane

(57) ABSTRACT

A chip card has a chip module, wherein the surface of the chip module contains electrically conducting contact surfaces that are arranged to be aesthetically integrated into the layout of the chip card.

1 Claim, 15 Drawing Sheets

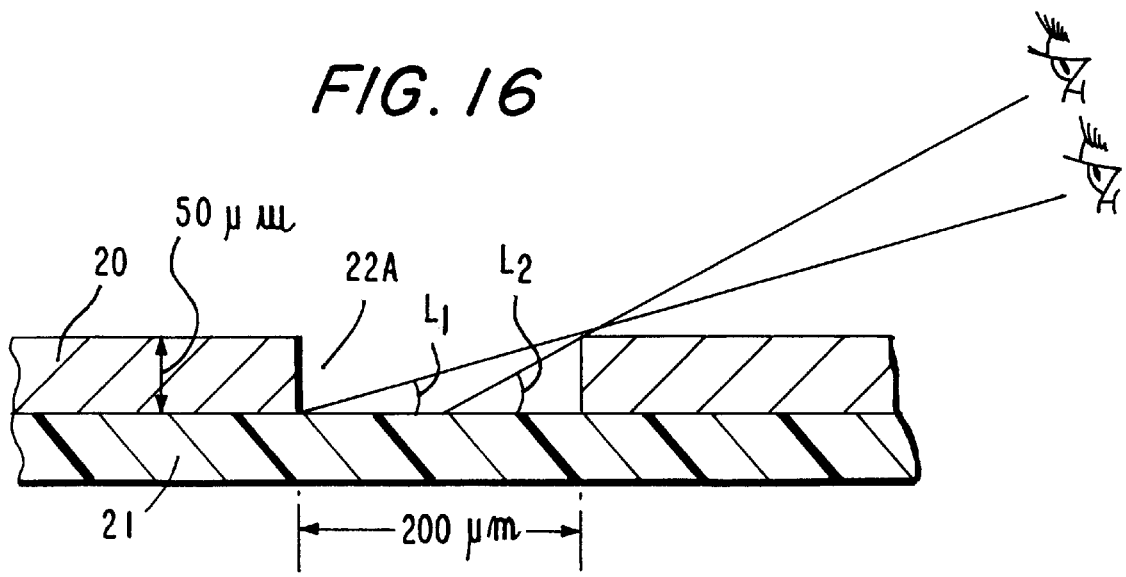
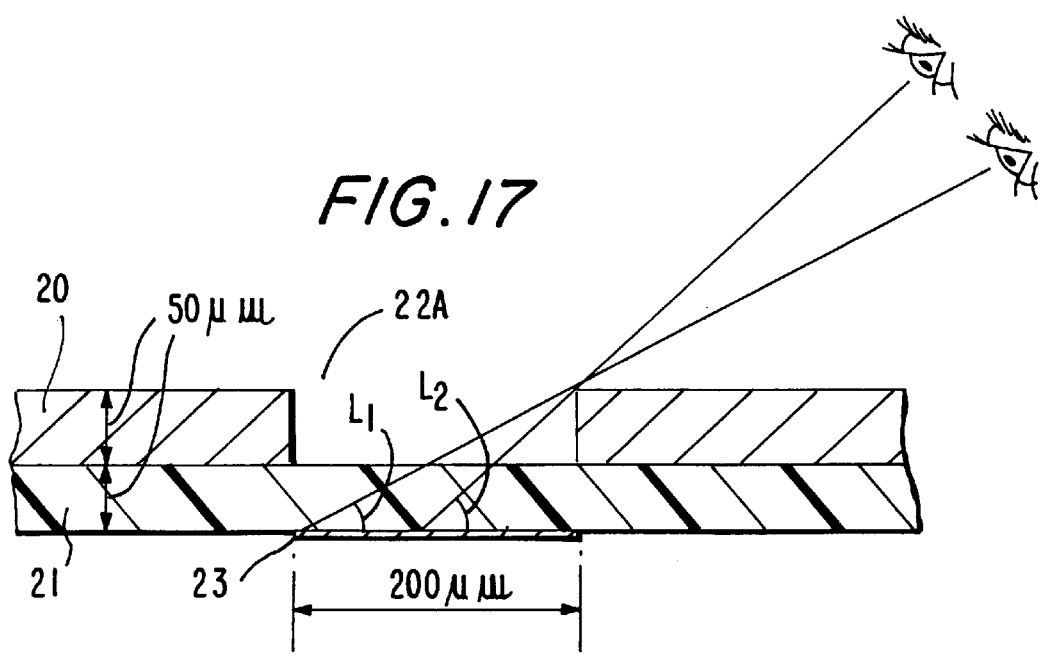

CHIP CARD

FIELD OF THE INVENTION

The invention related to a chip card that has a chip module, wherein the chip module is a carrier element for an IC computer/chip) (hereafter referred to as IC component with electrically conductive contact surfaces. These contact surfaces are connected in an electrically conductive fashion to corresponding connection points of the IC component making communication possible between the IC component and particular devices such as chip card terminals and automated machines) in which the chip card can be inserted and read. The chip module is fixed in a recess in the card body that opens toward the front side of the card. The surface of the chip module consist of a structured metallization that constitutes the electrically conductive contact surfaces, with insulating spaces (lines). The contact surfaces are arranged on the plane of front side of the card or minimally offset thereto (by approximately, ±0.1 mm).

BACKGROUND OF THE INVENTION

Chip cards of this type are already in widespread use as telephone cards, health insurance cards, GSM cards, bank cards and credit cards.

The layers of such cards (front and back sides of card) have a costly design. The visible surface of the chip module, with its contact surfaces, constitutes a foreign body in the layout of the front side of the card. This negatively impacts the appearance of the card and detracts from the layout design options. The contact surfaces have a metallization of either gold, silver or palladium; the palladium metallization is silver-colored in appearance. These metals are especially well-suited for forming contact surfaces, because they are inert, and do not oxidize or corrode, and because they permit very low transition resistances to the contacts of the chip card terminal. In addition, gold and palladium, especially with special alloy additives, have high wear resistance. For these reasons, the contact surfaces of chip cards currently use gold and palladium almost exclusively. In layout design, the only choice is thus between chip modules with gold-colored or those with silver-colored surfaces.

SUMMARY OF THE INVENTION

The object of the invention is therefore to create a chip card in which the surface of the chip module can be matched to the layout design on the front side of the card. In other words, the object of the invention is to produce a chip card having a chip module, wherein the surface of the chip module can be included as part of an aesthetic surface, design of the card so that design options for the appearance of the chip card are explained.

Because chip cards serve as sensitive data carriers and storage media with monetary value, special care must be taken, in attaining this object, to not impair their technical reliability. Further, because chip cards are a mass-produced article manufactured in large numbers, it is also important that the solution be economical.

DESCRIPTION OF THE DRAWINGS

In the drawings, wherein like reference numerals denote similar elements throughout the several views:

FIG. 16 shows a sectional view of an embodiment of the chip module which shows different viewing angles;

FIG. 17 shows a section view of another embodiment of the chip module which shows different viewing angles;

The object is attained by the characterizing features in patent claims 1 and 8 and in the respective related process claims 2 and 9. The subclaims contain advantageous embodiments of the invention.

DETAILED DESCRIPTION OF THE PREFERRED EMBODIMENTS

Figure 1:
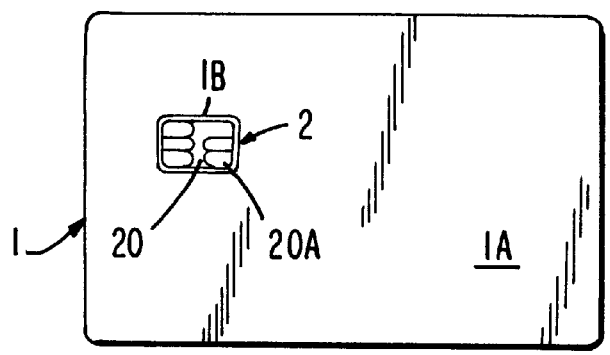
FIG. 1 shows the front surface of an embodiment of a chip card of the present invention.
Figure 2:
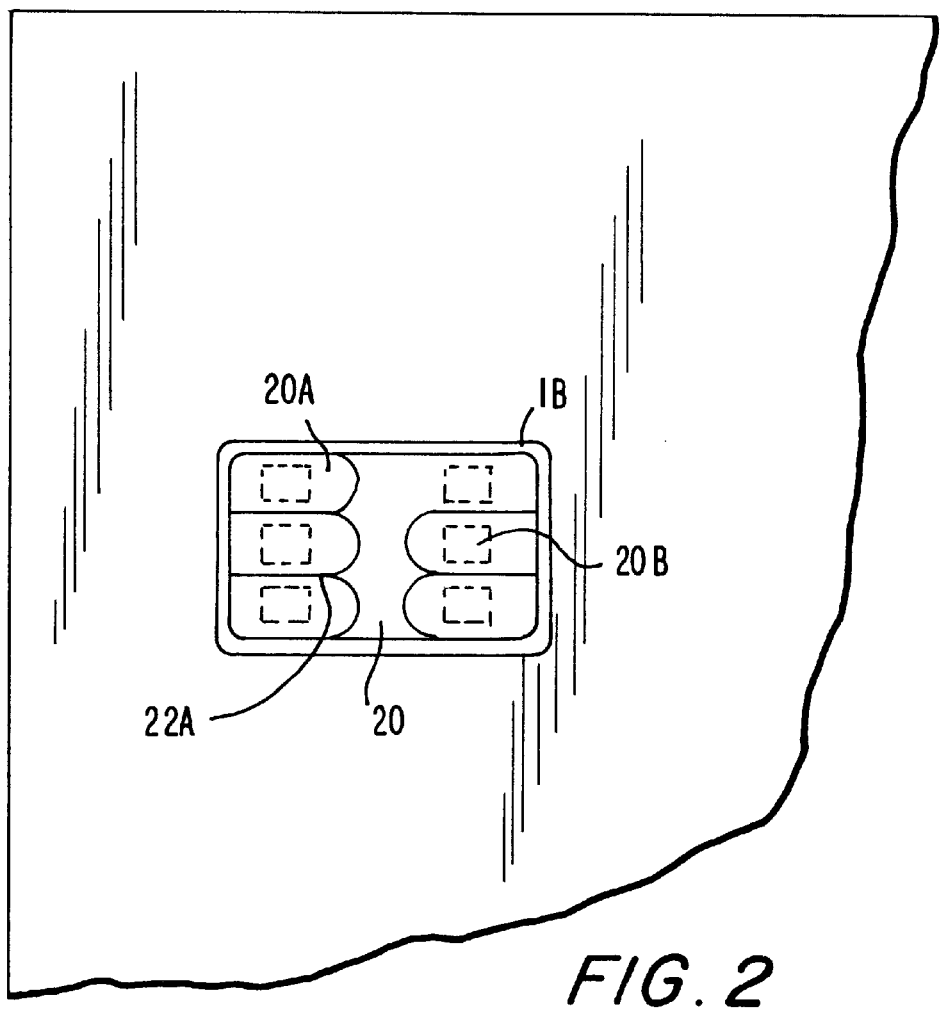
FIG. 2 shows a chip module installed in the chip card of FIG. 1.
Figure 3:
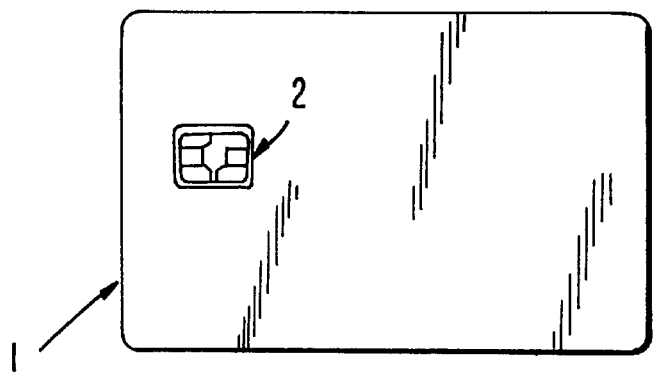
FIG. 3 shows the front surface of a second embodiment of a chip card of the present invention.
Figure 4:
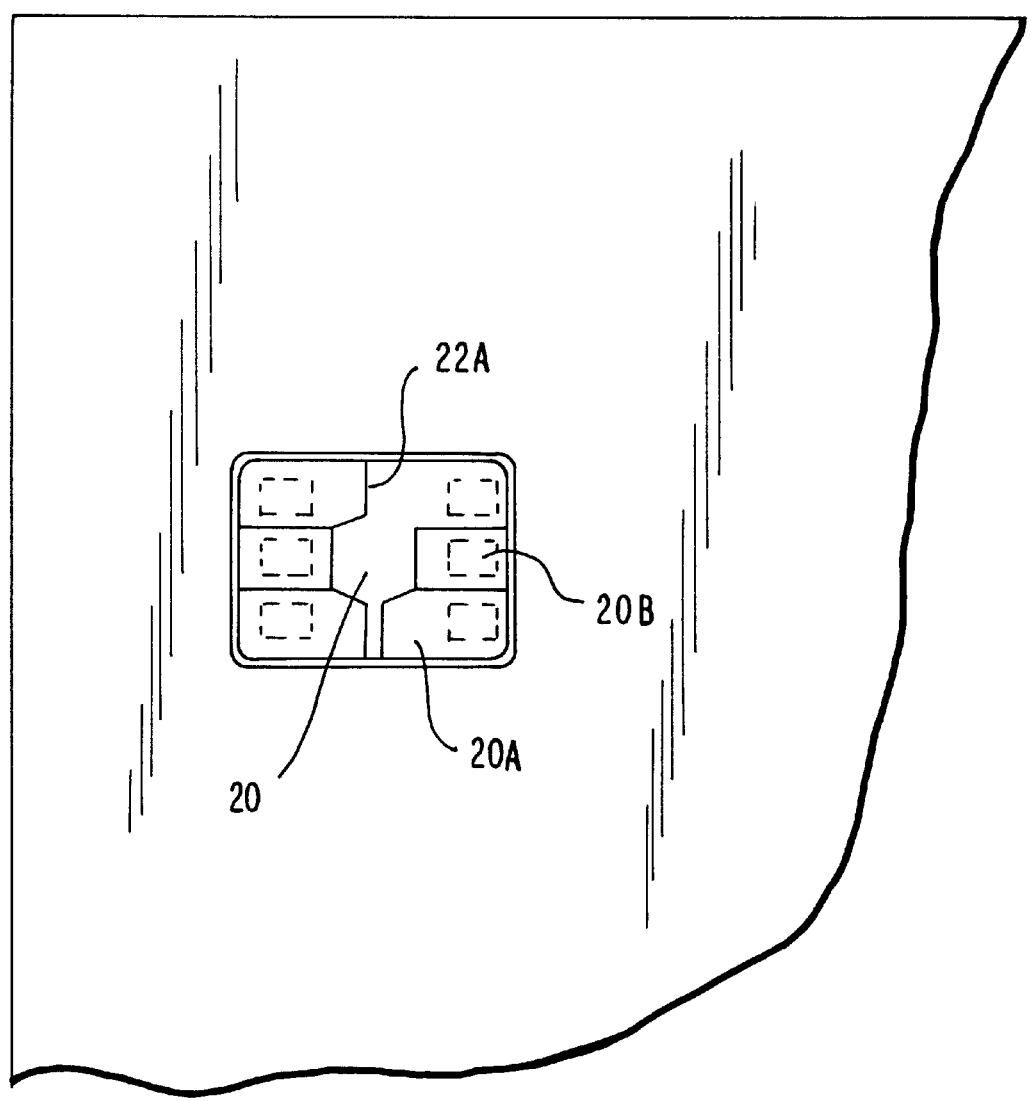
FIG. 4 shows a chip module installed in the chip card of FIG. 3.

FIG. 1 shows a top view of the front side of a standard chip card (1) with a chip module (2) embedded in a recess 1B with its electric contact surfaces (20A). FIG. 2 shows an enlarged section of the card (1) in FIG. 1 in the region of the chip module (2). The surface of the chip module (2) is a structured metallization (20), which comprises the electrically conductive contact surfaces (20A) and insulating spaces (22A). FIGS. 3 and 4 show the same contact surfaces (20A), but with a different structure. The positions of standard contact surfaces 20B in accordance with International Standard ISO 7816-2 are shown in FIG. 2.

The metallization (20), which is applied to a non-conductive plastic substrate (21) (see FIG. 9), is typically formed by coating the plastic substrate (21) with a layer of copper, then galvanically depositing a nickel layer on the copper layer, and then galvanically depositing a gold or palladium layer on the nickel layer. The copper layer typically has a thickness of 35 µm, the nickel layer a thickness of 15 µm, and the gold or palladium layer a thickness of 2 µm.

The intermediate product in the manufacture of chip modules (2) is a plastic substrate strip, to which large number of contact-surface units are applied.

In one embodiment according to the invention, the color of the contact surfaces (20A) is deliberately established by placing the aforementioned intermediate product into a coloring bath containing a coloring solution. The color of the contact surfaces (20A) is thereby produced by means of a chemical reaction on the surface and/or in the region near the surface of the metallization (20) (reaction layer thickness <1 µm). this can be done in a pure immersion process, without using an external power source, or in an electrolytic/galvanic process, using an external power source.

To color a gold ocntact surface green, for example, the following color solution can be used (see *Handbuch der Galvanotechnik*, Carl Hanser Verlag, Munich 1969, Vol. III, pp. 291–2, for example).

| potassium nitrate (30% by weight) | $KNO_3$ |
| iron (II) sulfate (10% by weight) | $FeSO_4 * 7H_2O$ |
| zinc sulfate (5% by weight) | $ZnSO_4 * 7H_2O$ |
| potassium aluminum sulfate (5% by weight) | $KAl(SO_4)_2 * 12H_2O$ |
| water (50% by weight) | $H_2O$ |

Coloring parameters such as temperature, coloring duration, and stirring or convection are optimally adjusted to the specific conditions of each case. By always using special coloring solutions, it is possible to cover a broad color spectrum.

Coloring is not limited to gold, palladium, or silver contact surfaces. Other metallizations (20) can also be colored and used as the outer contact surface layer.

Coloring does not disadvantageously influence functional properties, such as chemical stability, conductivity, wear resistance or light resistance.

By selectively masking the metallization (20) by photo resist before placing the metallization into a coloring solution, it is possible to produce contacts surface (20A) of different colors. Naturally, it is also possible to produce different colors on one ocntact surface. To illustrate, the process steps to produce a two-color stripe pattern are briefly described as follows:

1. Full area application of photo resist.
2. Exposure with stripe pattern mask for the first color.
3. Removal of non-fixed photo resist.
4. Introduction into first coloring bath.
5. Post-treatment of first coloring step.
6. Full area application of photo resist.
7. Exposure with strip pattern mask complementary to first mask for the second color.
8. Removal of non-fixed photo resist.
9. Introduction into the second coloring solution.
10. Post-treatment of second coloring step.

Of course, using the same process, three or more colors can then be applied in further steps.

A velour-like character can be given to the metallization (20) by means of insoluble additives in the coloring solution.

It should be noted that the solution variant described above can also be used for contact surfaces (20A) in the so-called lead frame technique. In this case, the metallization (20) that forms the contact surfaces (20A) is not applied to a plastic substrate.

In another embodiment according to the invention (see FIGS. 18–22), the metallization of the chip module has at least two surface regions, whose visible layers are formed from various metals and/or metal alloys with different light reflection and absorption properties. In producing chip modules for such chip cards, the following process is used:

A plastic substrate used in producing chip modules (2), to which a basic metallization comprising a first metallization layer 201 and a second metallization layer 202 for a large number of chip modules is applied, is placed in a galvanic bath, where a third metallization layer (203) comprising first and second surface regions (20*, 20**) is created by galvanic deposit with the help of selective masking.

Figure 18:
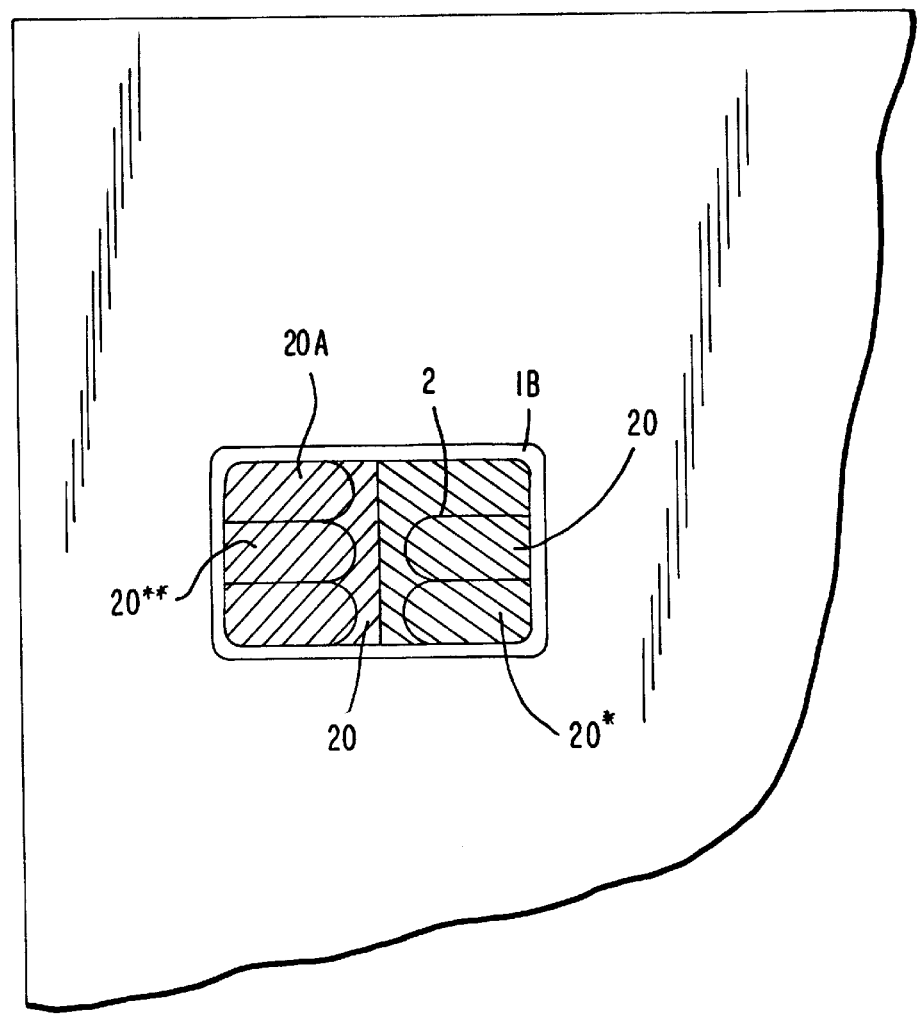
FIG. 18 shows another embodiment of a chip module installed in the chip card.
Figure 19:
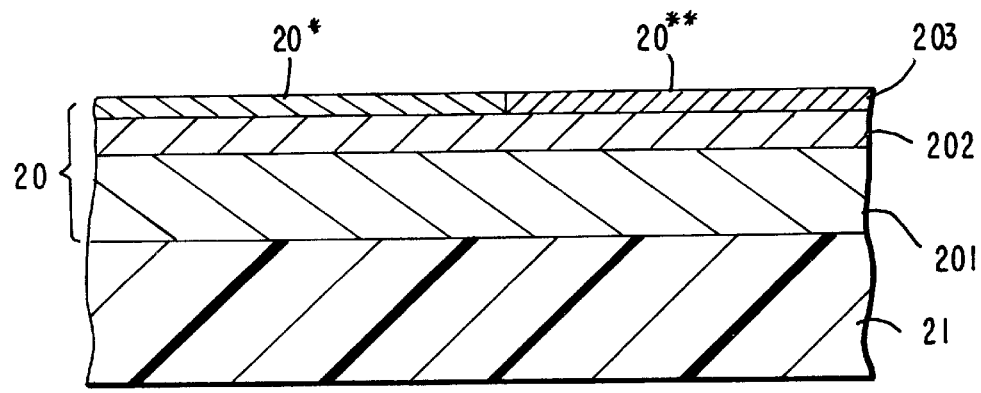
FIG. 19 shows a sectional side view of the chip module of FIG. 18.
Figure 20:
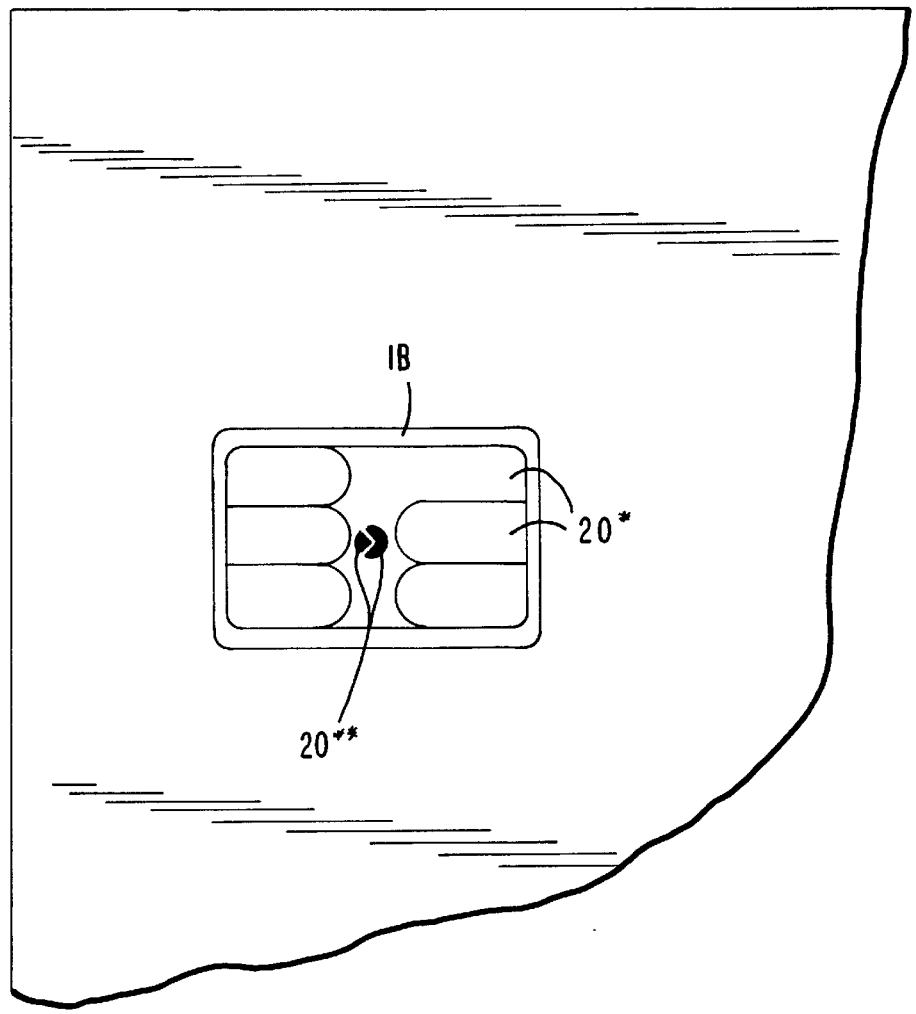
FIG. 20 shows yet another embodiment of a chip module installed in the chip card.
Figure 21:
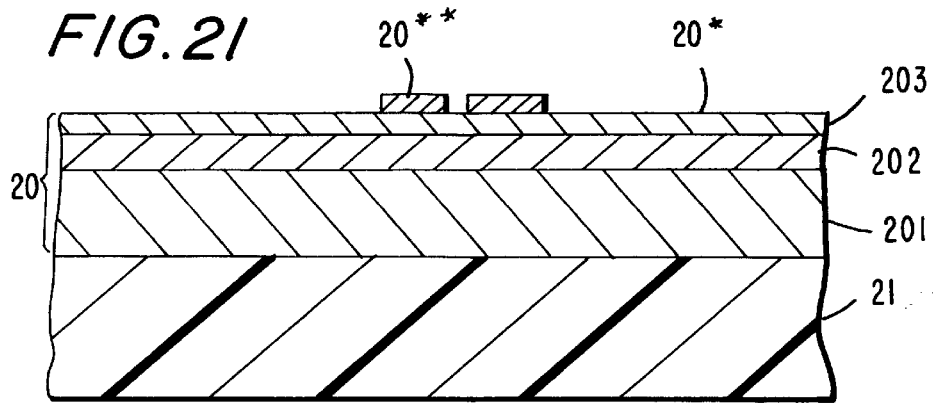
FIG. 21 shows a sectional side view of the chip module of FIG. 20.

FIG. 18 shows an enlarged detail of the card (1) in the region of the chip module (2). The surface of the chip module consists of a structured metallization (20) constituting the electrically conductive contact surface (20A). The metallization has two surface regions of different metals and/or metal alloys with different light reflection and absorption properties. FIG. 19 shows the layer structure of the metallization (20). On a non-conductive plastic substrate (22) coated with the first metallization layer (201) comprising copper, the second metallization layer (202) comprising nickel is galvanically deposited as a diffusion barrier. With the help of selective masking by photo resist, it is possible to apply different metal and/or metal alloys to first and second surface region surface regions (20*, 20**) of the second metallization layer (202). The basic metallization can also consist of three layers copper, nickel and gold).

In a first embodiment (see FIG. 19), the variously colored regions are located on one plane.

Figure 22:
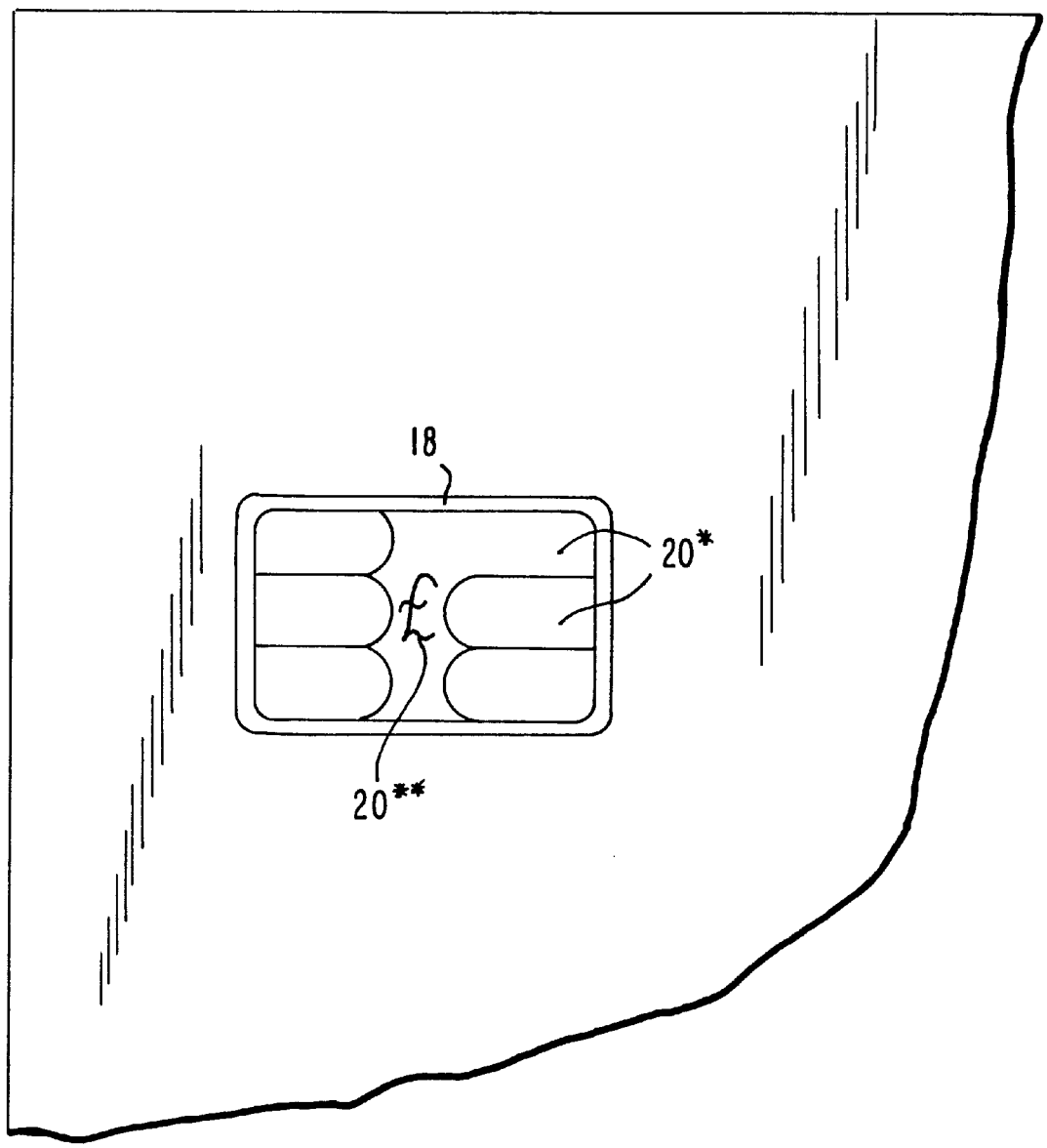
FIG. 22 shows still another embodiment of a chip module installed in the chip card.

In a second embodiment (see FIGS. 20, 21, 22), the second surface region (20**) is raised relative to the first surface region (20*). For example, the raised region is designed in one case as a corporate logo (FIG. 20) and in another as a currency sign (FIG. 22). For this purpose, in a first a first surface region (20*) comprising a first metal or metal alloy layer with certain light reflection and absorption properties is applied to the first and second layers (201, 202) over its entire area. In a second step, a second surface region (20**) comprising a second metal or metal alloy layer with different light reflection and absorption properties is galvanically applied to the first surface region (20*) in one or more partial areas to create the second surface region (20**).

The surface region (20*) may also be raised relative to the a second surface region (20). For this purpose, in a first step, a first metal or metal alloy layer with certain light reflection and absorption properties is applied to the first and second layers (201, 202) over its entire area. In a second step, a second metal or metal alloy layer with different light reflection and absorption properties than the first is applied galvanically to the first metal or metal alloy layer to form the second surface area (20). In a third step, the second metal or metal alloy layer (20**) is removed locally by an electrochemical process (e.g., an etching process), so that the underlying first metal or metal alloy layer becomes visible.

Advantageous embodiment variants for the color design of the visible chip module surface are described below.

For reasons of standarization, International Standard ISO 7816-2 prescribes the position and minimum size for standard contact surfaces (20B); these standard contact surfaces (20B) are not permitted to be smaller than 2 mm×1.7 mm.

The standard contact surfaces (20B) are shown in dashed lines in FIGS. 2 and 4. To create the contact surfaces (20A), insulating spaces (lines, 22A) are provided in the metallization (20). According to the invention, a colored plastic substrate (21), which can be seen through the open insulating spaces (lines, 22A), is then used (see also FIG. 9). In this instance, "colored" can also refer to a fluorescent plastic substrate (21). A wide variety of materials can be used for the plastic substrate (21), such as polyvinylchloride (PVC), polyethylene, and fiberglass-reinforced epoxy resin.

To an observer who looks at the card (1) at an angle greater than $L_1$ relative to the contact surfaces (20A), the colored plastic substrate (21) is no longer visible, due to shading by the metallization (20) as shown in FIG. 16. In the example in FIG. 16, where the width of the insulating space is 200 $\mu$m and the total layer thickness of metallization is 50 $\mu$m, this overall shading angle $L_1$ is 16°. In other words at viewing angles ranging from the vertical view (90°) to an angle of 16°, the colored plastic substrate (921) is at least partially visible. The viewing angle at which half-shading occurs is identified by $L_2$. In the configuration shown in FIG. 16, this angle ($L_2$) is 30°. It is thus clear that up to half of the colored plastic substrate (21) remains visible in a relatively large viewing angle range.

Figure 7:
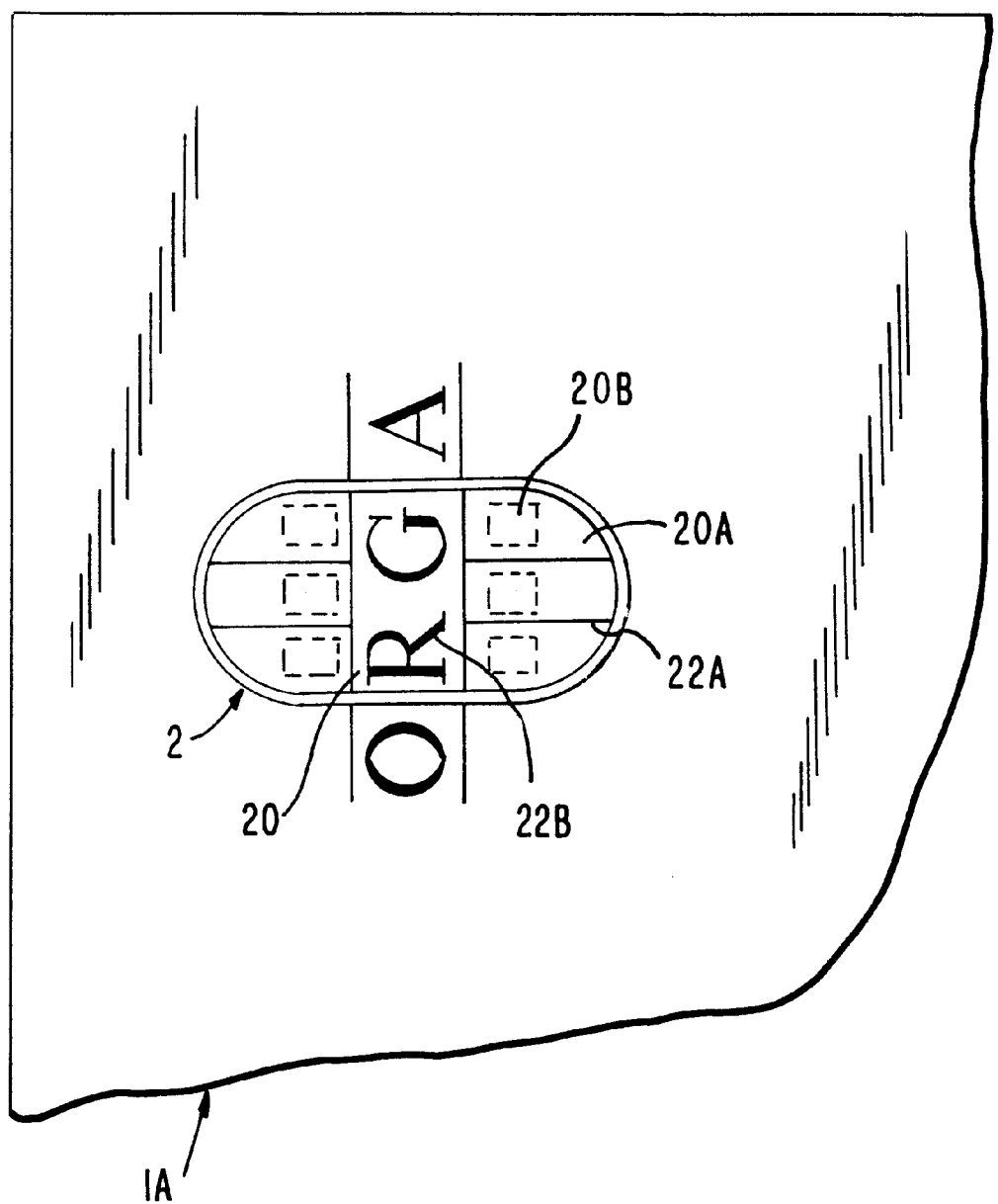
FIG. 7 shows a chip module on a chip card with a design across the chip module between the contacts.
Figure 15:
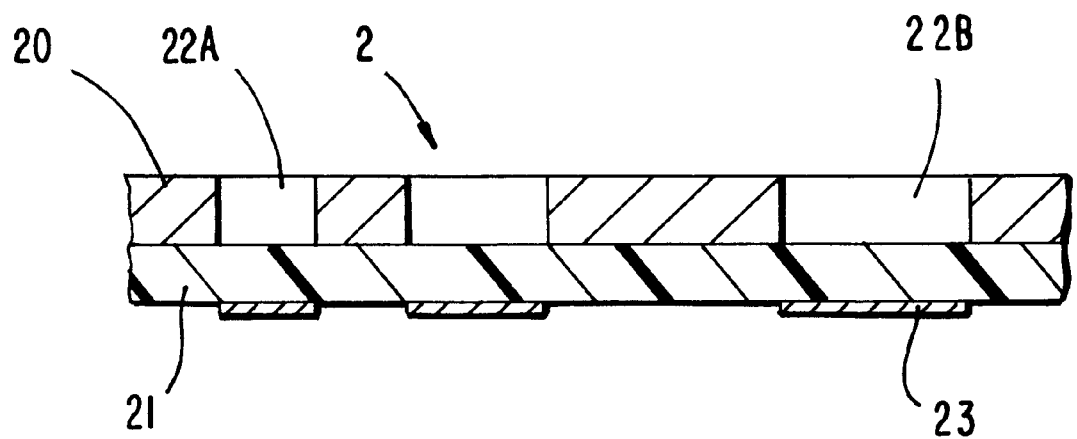
FIG. 15 shows a sectional side view of another embodiment of the chip module of FIG. 12.

In addition to the insulating spaces (lines, 22A), other blank spaces (22B) through which the colored plastic substrate (21) is visible may also be (see FIGS. 7 and 15).

These various embodiment enable a wide variety of layout designs.

Figure 5:
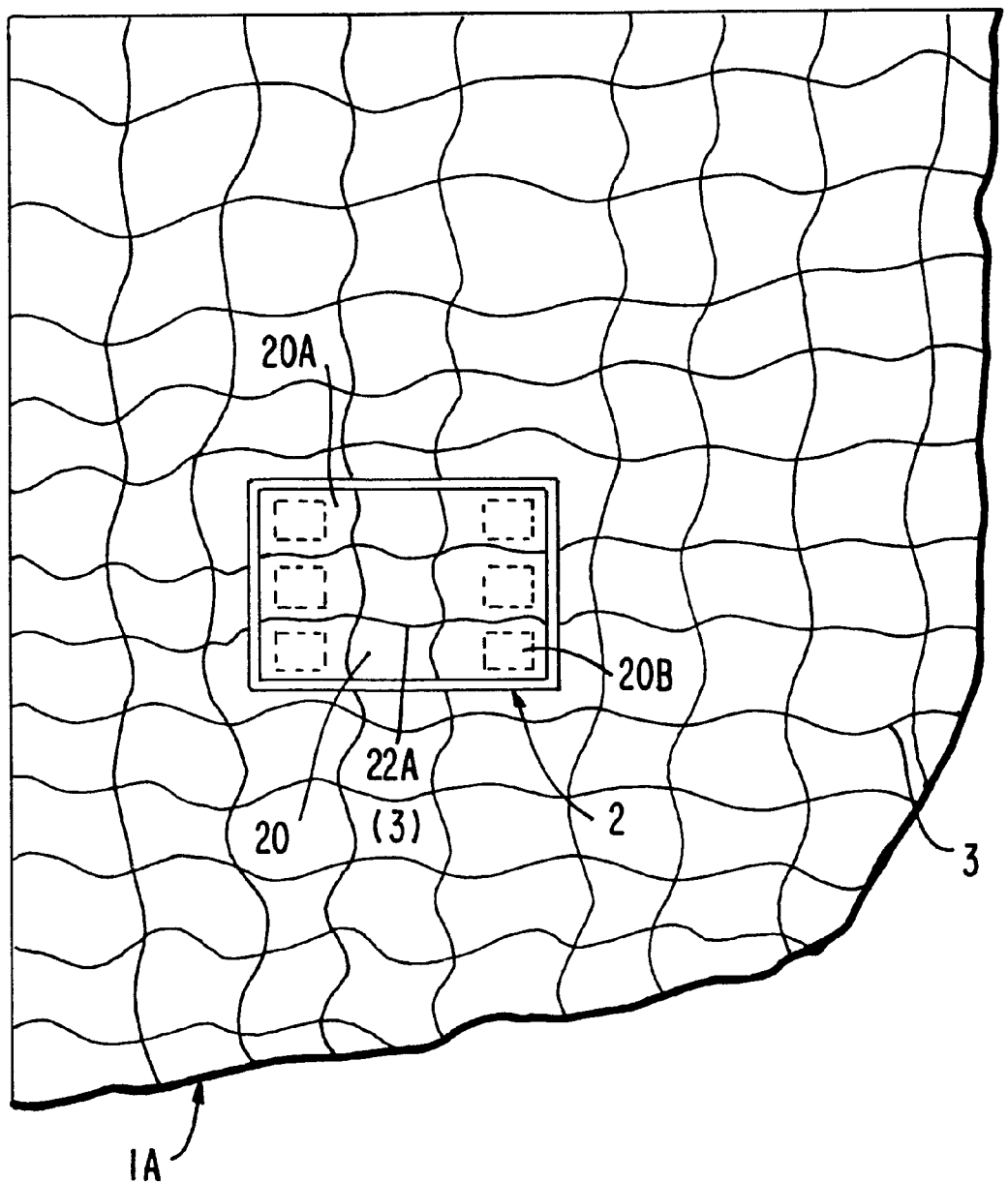
FIG. 5 shows a chip module mounted on a chip card with a design which continues from the card surface to the chip module surface.

FIG. 5 shows a section of a top view of a chip card (1) with a wave pattern (3). The lines forming the wave pattern (3) continue, on the metallization that forms the contact surfaces (20A), in the form of insulating lines (22A) between the standard contact surfaces (20B). If the color red, for example, is selected for the wave pattern (3) printed on the card body (1A), then a red plastic substrate (21) is used. In conjunction with the contact surfaces colored according to the invention, it is then possible to attain uniform color behind the wave pattern (3) on the entire side of the card, including the chip module surface. The surface of the chip module (2) is thus integrated into the card layout and does not constitute a foreign body. In addition, significant added protection is provided against counterfeiting, because this chip module (2), with a surface that has been structured and colored quite specifically for a particular card type, would arouse suspicion if used in a different card body.

Figure 6:
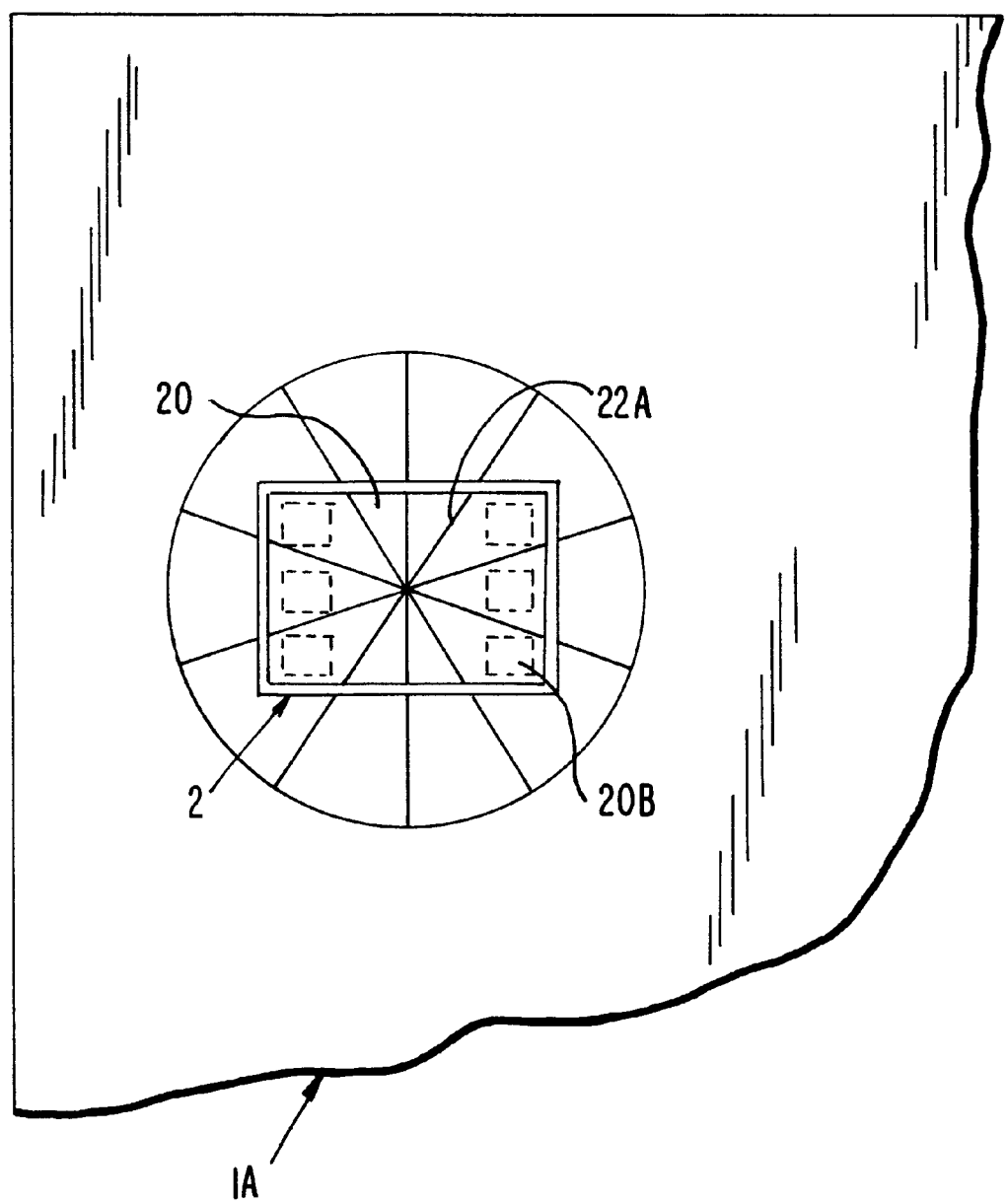
FIG. 6 shows a chip module mounted on a chip card with another design.

FIG. 6 shows a further layout design. The image is a wheel with spokes, which continue in the form of insulating spaces (lines, 22A) between the standard contact surfaces (20B). A color match between the pattern sections located on the card body (1A) and those sections on the surface of the chip module (2) is easily possible.

FIG. 7 shows a further layout design. The image here is a corporate logo. On the front side of the card, an initial is printed on both sides of the chip module (2), while two other letters are formed by additional spaces (22B) in the metallization (20). By choosing a suitably colored plastic substrate (21), a color match can also be easily achieved in this case.

Figure 8:
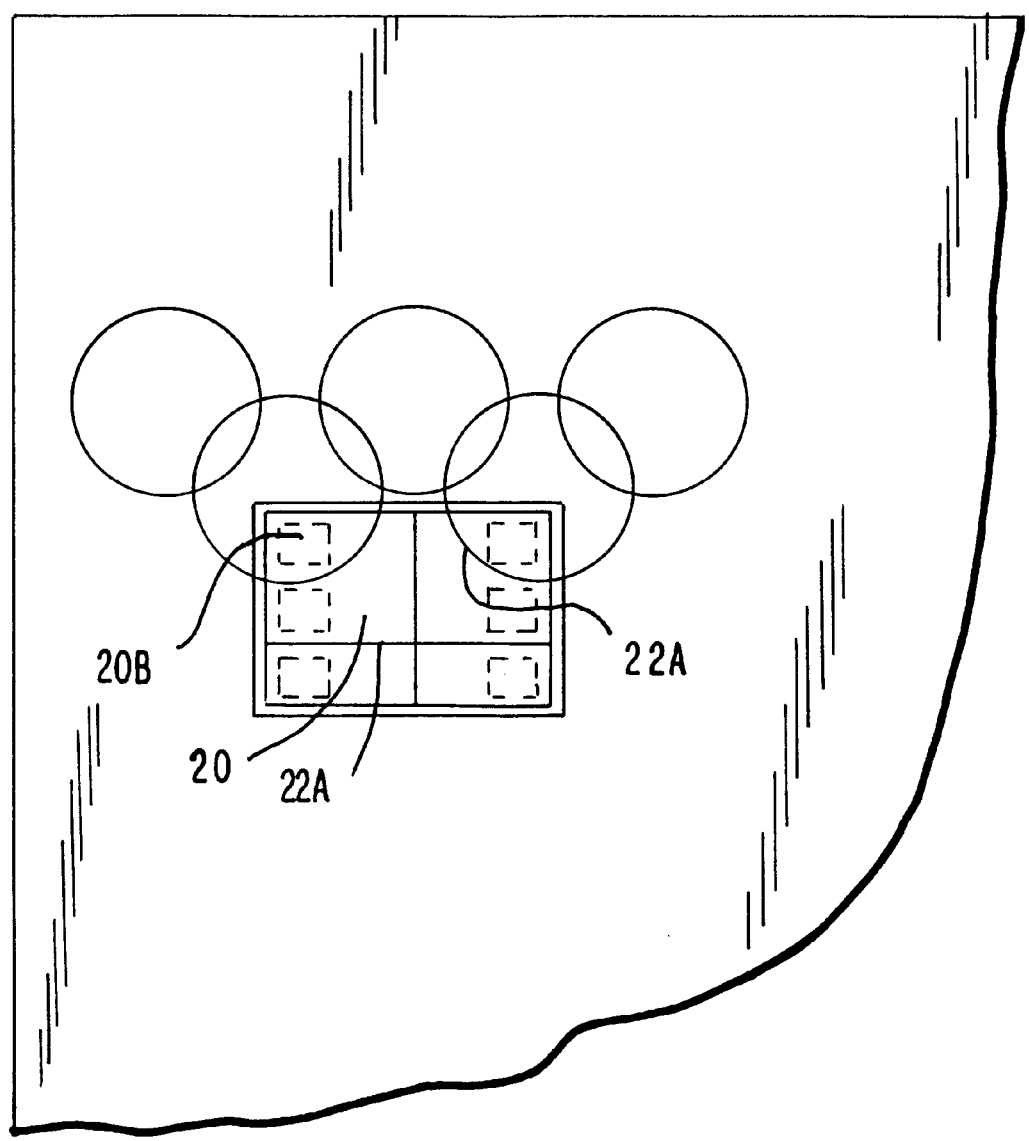
FIG. 8 shows a chip module on a chip card with a design which covers some of the contacts.

In another embodiment variant, the plastic substrate (21) is completely or partially transparent. On the side facing away from the metallization (20) (back side) of the plastic substrate (21), one or more colored patterns (23) are applied, so that the color pattern (23) is visible through the plastic substrate (21) and the blank spaces (22A, 22B) (see FIGS. 8, 15, 17). FIG. 8 shows a layout design that can be realized with this embodiment variant. The motif is the Olympic rings. Two ring segments continue in the form of insulating spaces (lines, 22A) on the metallization (20). The ring segments applied to the back side of the plastic substrate (21) are designed on different colors. Corresponding to the other insulating spaces (lines, 22A), the back side of the plastic substrate (21) is printed in a gold color that matches the color of the gold contact surfaces (20A), so that these spaces (lines, 22 A) do not differ in color from the metallization (20). In this way, the chip module (2) can be hidden in the card layout. The color pattern (23) can also be printed or sputtered onto the back side of the plastic substrate (21).

Again in this case, a total shading angle ($L_1$) and a half-shading angle ($L_2$) can be specified for the visibility of the color pattern (23) applied to the back side of the plastic substrate (21) (see FIG. 17).

In the example shown in FIG. 17, where the width of the insulating space is 200 $\mu$m, the layer thickness of metallization is 50 $\mu$m, and the thickness of transparent plastic substrate is 50 $\mu$m, the total shading angle ($L_1$) is 60° and the half-shading angle ($L_2$) is 50°. Thus the colored motif can again be seen through the insulating spaces (22A) in a relatively large viewing angle range.

Figure 11:
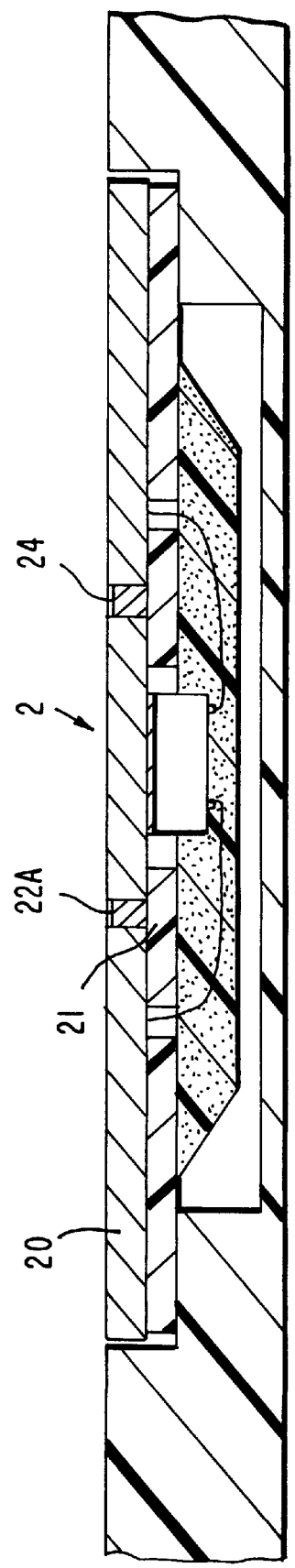
FIG. 11 is a sectional side view of still another embodiment of the chip module mounted in the chip card of FIG. 9.

Referring to FIG. 11, in a further embodiment, color (24) is introduced into the insulating spaces (lines, 22a) in the metallization (20).

Figure 12:
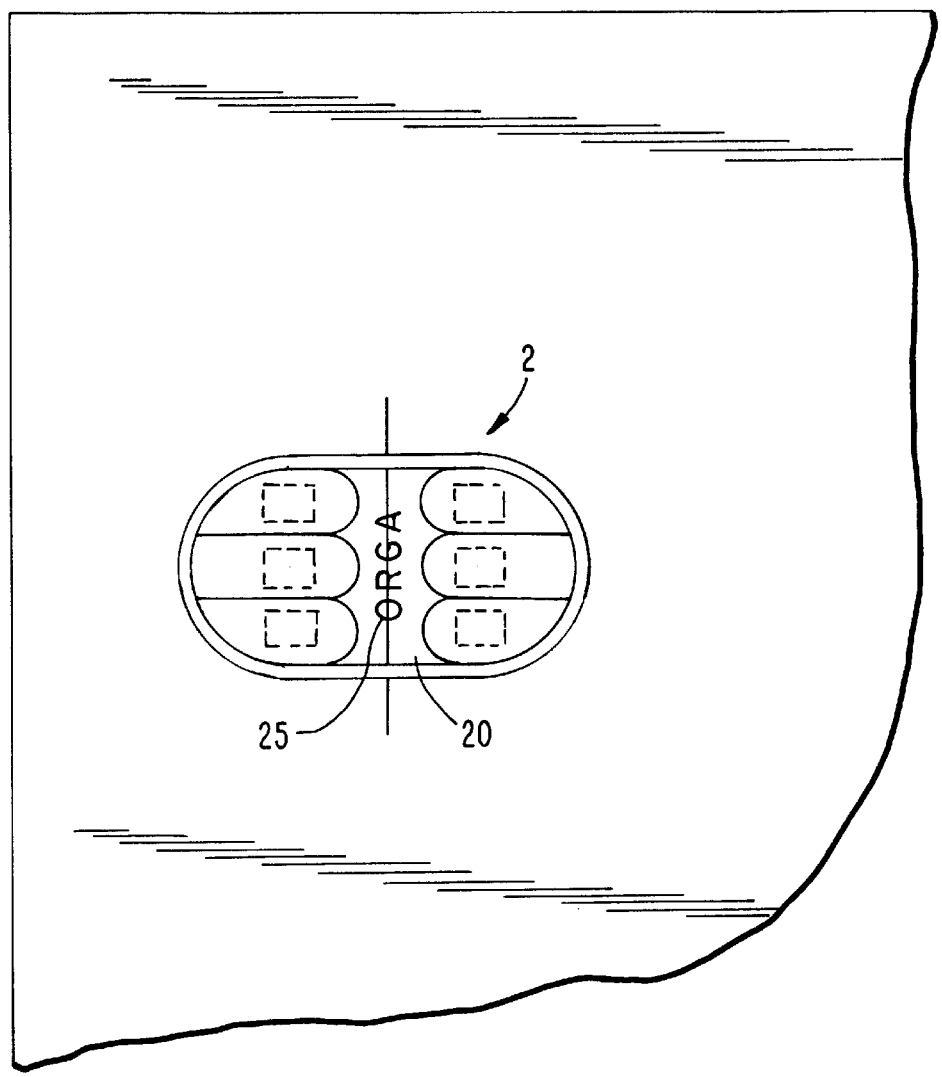
FIG. 12 shows a chip module mounted in a chip card with a design on the chip module only.
Figure 13:
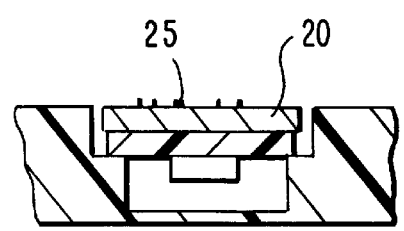
FIG. 13 shows a sectional side view of the chip module of FIG. 12.
Figure 14:
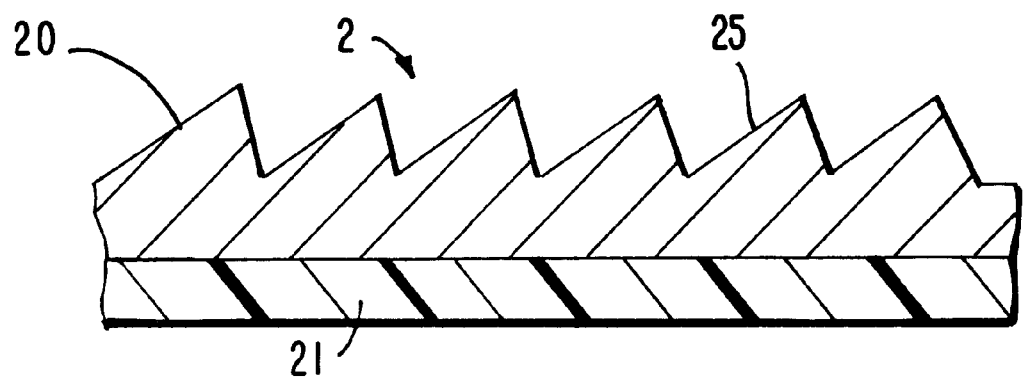
FIG. 14 shows a sectional side view of another embodiment of the chip module of FIG. 12.

Referring to FIGS. 12 and 13, in a further embodiment for the purpose of influencing the light reflection, the metallization (20) that forms the contact surfaces (20A) has raised structures (25) in the $\mu$m and/or sub $\mu$m range, which can be pressed into the metallization (20) or created by galvanic metal deposition. For example, FIG. 12 shows alphanumeric characters which form a company logo that exists on the metallization (20) in the form of an raised structure (25). FIG. 13 shows a section through the chip card (1) in the area of this raised structure (25). Raised structures (25) can also be embodied as a surface relief, corresponding to a rainbow hologram. Scale-like structures are also possible, for example, which produce multi-colored iridescent light reflections (see FIG. 14).

Figure 9:
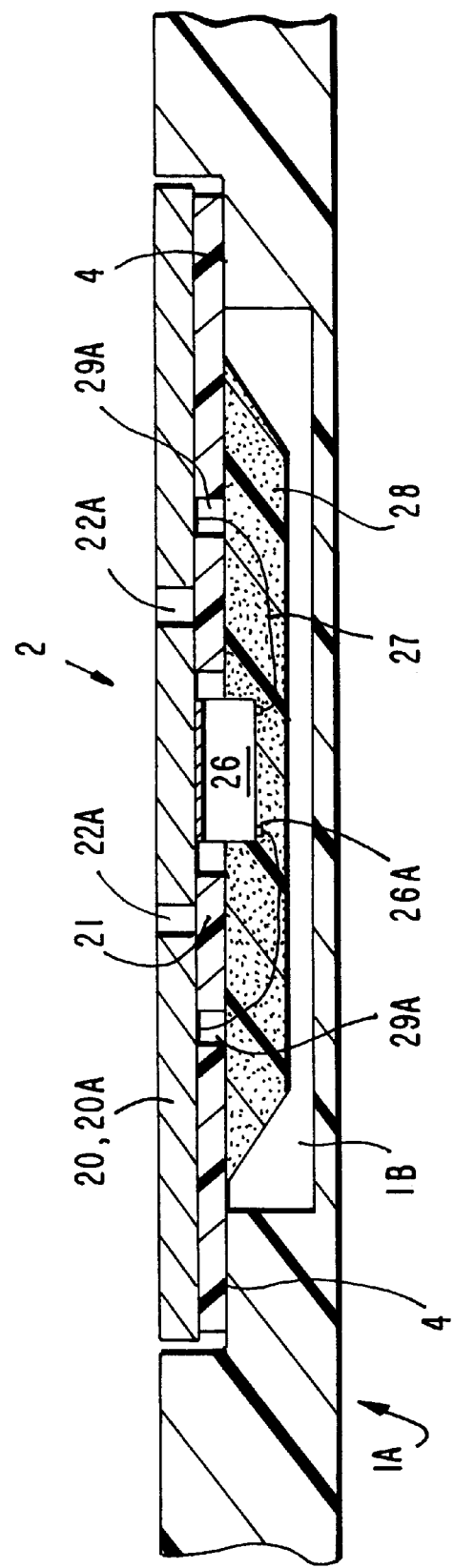
FIG. 9 is a sectional view of an embodiment of the chip module mounted in the chip card.
Figure 10:
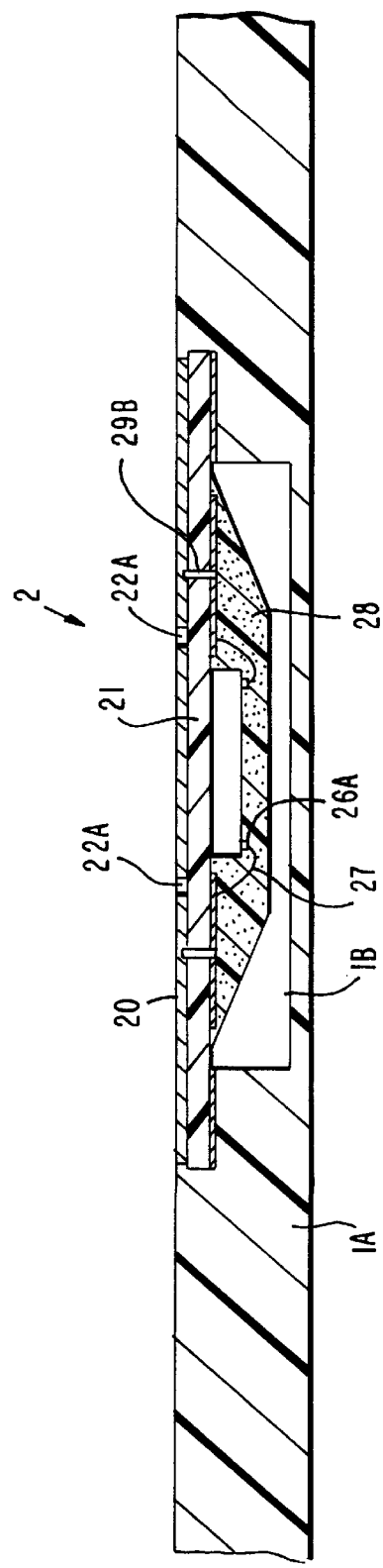
FIG. 10 is a sectional side view of another embodiment of the chip module mounted in the chip card of FIG. 9.

Finally, FIGS. 9 and 10 will be described in greater detail to explain the structure of the chip module (2):

FIG. 9 shows a chip module (2) implanted in a card body (1A). The chip module (2) consists of the contact surfaces (20A), which are connected in an electrically conductive fashion to connection points (26A) of the IC component (26) via bonding wires (27). The IC component (26) and the bonding wires (27) as well as the connection points (26A) of the bonding wires (27) on the IC component (26) and on the contact surfaces (20A) are surrounded by a sealing compound (28) for protection against mechanical stress, oxidation and moisture. The IC component (26) is placed in a central recess in the plastic substrate (21) and fixed with an adhesive, preferably an electrically conductive adhesive, to a mass-related contact surface (20A). For the passage of the bonding wires (27) to the contact surfaces (20A), the plastic substrate (21) has contact access openings (29A). The chip module (2) is fixed with a hot-setting adhesive layer (4) in a recess (1B) in the card body (1A). This hot-setting adhesive layer (4) can also be colored according to the invention. In FIG. 10, the IC component (26) is fixed on the plastic substrate (21). The bonding wires (27) are electrically connected to the contact surfaces (20A) by through-contacts (29B).

The invention is not limited by the embodiments described above which are presented as examples only but can be modified in various ways within the scope of protection defined by the appended patent claims.

What is claimed is:

1. A process for producing a chip card having a chip module and a structured metallization on said chip module for forming contact surfaces, comprising the steps of:

applying first and second metallization layers on a plastic substrate of said chip module via a first galvanic deposition to create a base for said chip module;

introducing said base to a coloring bath for creating at least two different surface regions on said first and second metallization layers of said base via a second galvanic deposition by selectively masking portions of said base during said step of introducing said base to said coloring bath, such that said at least two different surface regions comprise a portion of a design on the chip card, said step of creating at least two different surface regions including the steps of applying a first surface region layer comprising a first metal or metal alloy with first light reflection and absorption characteristics to an entire surface of one side of said base, applying a second surface region comprising a second metal or metal alloy with second light reflection and absorption characteristics to one of an entire surface and a partial region of said one side of said base, and selectively removing portion of said second surface region layer using an electrochemical process such that said first region layer is visible through said second surface region layer where said second surface region layer is removed.

* * * * *